(12) United States Patent
Lefevre et al.

(10) Patent No.: US 10,707,779 B2
(45) Date of Patent: Jul. 7, 2020

(54) THREE-PHASE SWITCH ARCHITECTURE

(71) Applicant: Commissariat à l'Énergie Atomique et aux Énergies Alternatives, Paris (FR)

(72) Inventors: Guillaume Lefevre, Aix les Bains (FR); Luis-Gabriel Alves Rodrigues, Chambery (FR); Jean-Paul Ferrieux, Meylan (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 62 days.

(21) Appl. No.: 15/855,251

(22) Filed: Dec. 27, 2017

(65) Prior Publication Data

US 2018/0191272 A1 Jul. 5, 2018

(30) Foreign Application Priority Data

Dec. 29, 2016 (FR) ...................................... 16 63514

(51) Int. Cl.
*H02M 7/537* (2006.01)
*H05K 7/14* (2006.01)
(Continued)

(52) U.S. Cl.
CPC ...... *H02M 7/537* (2013.01); *H01L 23/49838* (2013.01); *H01L 25/07* (2013.01); *H01L 25/072* (2013.01); *H01L 25/115* (2013.01); *H01L 27/0727* (2013.01); *H01L 31/042* (2013.01); *H02J 3/383* (2013.01); *H02M 7/003* (2013.01);
(Continued)

(58) Field of Classification Search
CPC ...... H02M 7/537; H02M 7/003; H02M 1/088; H01L 23/49838; H01L 25/072; H01L 31/042; H01L 25/115; H01L 27/0727; H01L 25/07; H01L 31/02008; H01L 2224/48091; H02J 3/383; H05K 7/1432
See application file for complete search history.

(56) References Cited

U.S. PATENT DOCUMENTS 4,875,088 A * 10/1989 Egawa ................ H01L 23/4827
257/751
5,563,447 A * 10/1996 Lake ..................... H01L 23/645
257/692
(Continued)

FOREIGN PATENT DOCUMENTS

EP 2 367 281 A2 9/2011

OTHER PUBLICATIONS

Mao, et.al., "A Single-Stage High Gain Current Source Inverter for Grid-Connected Photovoltaic System," 9th International Conference on Power Electronics-ECCE Asia Jun. 1-5, 2015, pp. 1902-1907 (Year: 2015).*

(Continued)

*Primary Examiner* — Pinping Sun
(74) *Attorney, Agent, or Firm* — Wolf, Greenfield & Sacks, P.C.

(57) ABSTRACT

A three-phase switching unit including three identical switching cells, each including at least one first electrically-controlled switch in series with at least one second spontaneous conduction switch, wherein the cells are arranged, around a conductive central area of a substrate, with a symmetry of revolution of order 3.

19 Claims, 7 Drawing Sheets

(51) Int. Cl.
  H01L 25/07 (2006.01)
  H01L 23/498 (2006.01)
  H01L 25/11 (2006.01)
  H01L 27/07 (2006.01)
  H01L 31/042 (2014.01)
  H02J 3/38 (2006.01)
  H02M 7/00 (2006.01)
  H01L 31/02 (2006.01)
  H02M 1/088 (2006.01)

(52) U.S. Cl.
  CPC ...... *H05K 7/1432* (2013.01); *H01L 31/02008* (2013.01); *H01L 2224/48091* (2013.01); *H02M 1/088* (2013.01)

(56) References Cited

U.S. PATENT DOCUMENTS

| | | | | |
|---|---|---|---|---|
| 6,002,183 | A * | 12/1999 | Iversen | H01L 23/467 257/691 |
| 6,501,172 | B1 * | 12/2002 | Fukada | H01L 23/473 257/706 |
| 6,501,653 | B1 * | 12/2002 | Landsgestell | H02M 7/003 165/185 |
| 8,310,118 | B2 * | 11/2012 | Gieras | H02P 25/02 310/68 D |
| 9,583,946 | B2 * | 2/2017 | Fornage | H02J 3/383 |
| 9,648,736 | B2 * | 5/2017 | Burns | H02M 7/003 |
| 9,698,698 | B2 * | 7/2017 | Heid | H02M 5/10 |
| 2006/0108684 | A1 * | 5/2006 | Stevanovic | H01L 24/49 257/728 |
| 2009/0284213 | A1 * | 11/2009 | Ward | H01L 25/072 318/801 |
| 2013/0336033 | A1 | 12/2013 | Hirler et al. | |
| 2016/0157384 | A1 * | 6/2016 | Liu | H05K 1/028 361/709 |
| 2016/0276927 | A1 * | 9/2016 | Das | H01L 29/1608 |
| 2017/0110923 | A1 * | 4/2017 | Dajaku | H02K 3/28 |
| 2017/0110984 | A1 * | 4/2017 | Jahn | H05K 7/209 |
| 2017/0309555 | A1 * | 10/2017 | Shimakawa | H01L 23/49568 |
| 2018/0191264 | A1 * | 7/2018 | Lefevre | |

OTHER PUBLICATIONS

Preliminary French Search Report for Application No. FR 1663514 dated Sep. 14, 2017.

* cited by examiner

THREE-PHASE SWITCH ARCHITECTURE

This application claims priority to French patent application number 16/63514, filed Dec. 29, 2016, the content of which is incorporated herein by reference in its entirety to the maximum extent allowable by law.

BACKGROUND

The present disclosure generally relates to electronic power conversion circuits, and more particularly to the forming of a three-phase current inverter. The present disclosure more particularly relates to the architecture of a static power converter intended for applications of current inverter type (direct current DC-to-alternating current AC).

DISCUSSION OF THE RELATED ART

A three-phase DC-to-AC static power converter is generally based on two sets of three (or three sets of two) electronic switches, typically MOS power transistors (MOSFET) associated with diodes.

Voltage inverters, where the transistors are directly series-connected two by two and each transistor is equipped with a diode in antiparallel, can be distinguished from current inverters, where each transistor is series-connected with a diode to form a switch which is bidirectional in terms of voltage and unidirectional in terms of current. The present disclosure more specifically targets current inverters.

In power applications, the transistors and the diodes are generally formed individually in the form of discrete components or bare chips. Each controlled switching switch (transistor) or spontaneous switching switch (diode) is manufactured in the form of an individual chip based on semiconductor materials and the different chips are then assembled on a substrate (printed circuit board—PCB, direct bond copper—DBC, insulated metal substrate—IMS, for example, a metal substrate at the surface of a ceramic, etc.) and then electrically connected to carry out the three-phase current inverter function.

There is a need to improve three-phase current inverters, and in particular their spatial architecture.

SUMMARY

An embodiment overcomes all or part of the disadvantages of three-phase current inverters.

An embodiment provides a solution enabling to homogenize the operating stress between the different switches of a three-phase current inverter.

An embodiment provides a solution particularly adapted to the forming of a current inverter.

Thus, an embodiment provides a three-phase switching unit comprising three identical switching cells, each comprising at least one first electrically-controlled switch series-connected with at least one second spontaneous conduction switch, wherein the cells are arranged, around a conductive central area of a substrate, with a symmetry of revolution of order 3.

According to an embodiment, the spontaneous conduction switches are assembled in the conductive central area with a symmetry of revolution of order 3.

According to an embodiment, the central area also has a symmetry of revolution of order 3.

According to an embodiment, the switch(es) of the switching cells are arranged on conductive peripheral areas of the substrate having a symmetry of revolution of order 3.

According to an embodiment, the central area and the peripheral areas approximately form a Y.

According to an embodiment, the conductive central area supports no component.

According to an embodiment, the conductive central area has a substantially hexagonal shape.

According to an embodiment, said first switch(es) are transistors.

According to an embodiment, said spontaneous conduction switch(es) are diodes or MOS transistors.

According to an embodiment, each switch is welded to a conductive area by a back-side metallization of a chip made of semiconductor materials, defining an electrode of the switch.

According to an embodiment, the conductive central area defines a terminal of electric interconnection of the three cells.

According to an embodiment, the substrate is an insulated metal substrate, preferably on ceramic.

An embodiment provides a three-phase current inverter, comprising two units.

According to an embodiment, the cells of the two units are electrically connected two by two, the interconnection nodes defining three phase terminals.

An embodiment provides a system comprising:
at least one assembly of photovoltaic panels; and
at least one current inverter.

The foregoing and other features and advantages will be discussed in detail in the following non-limiting description of specific embodiments in connection with the accompanying drawings.

DETAILED DESCRIPTION

Figure 1:
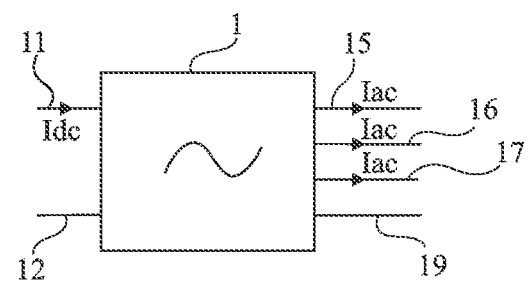
FIG. 1 is a simplified representation in the form of blocks of a three-phase inverter of the type to which the described embodiments apply.

For clarity, only those elements which are useful to the understanding of the described embodiments have been shown and will be detailed. In particular, the control of a power converter based on the described three-phase inverters has not been detailed, the described embodiments being compatible with usual industrial manufacturing processes and control circuits. Further, the structure and the forming of the circuits upstream and downstream of the described three-phase inverters have not been detailed either, the described embodiments being compatible with usual applications of such three-phase inverters. It should be noted that, in the drawings, the structural and/or functional elements common to the different embodiments may be designated with the same reference numerals and may have identical structural, dimensional, and material properties. Unless otherwise specified, expressions "approximately", "substantially", and "in the order of" mean to within 10%, preferably to within 5%, or to within 10°, preferably to within 5°.

Document U.S. Pat. No. 6,501,172 describes a three-phase voltage inverter where switches are connected in parallel with diodes, a switching cell being formed of a switch electrically connected in parallel with a diode. In a voltage inverter, the diode of a cell conducts while the switch (in parallel) of the same cell is blocked. To form a three-phase voltage inverter, three cells are paired in parallel and are connected with a point common to three other cells. Thus, the six cells have a common junction point.

Document EP 2 367 281 describes a three-phase current inverter of the type to which the described embodiments apply. Each switching cell comprises a controllable switch (a transistor) in series with a diode. Six cells are series-connected, two by two, between two terminals of application of a DC voltage. The junction points of the series associations define the three phases of the three-phase voltage. In a three-phase current inverter, the diode of a cell conducts at the same time as the switch which is series-connected therewith. The cells are paired two by two in series and three pairs of series-connected cells are connected in parallel, the junction points of each pair defining a phase.

FIG. 1 is a simplified representation in the form of blocks of three-phase current inverter of the type to which the described embodiments apply.

The function of a three-phase current inverter 1 is to convert a DC current Idc flowing between two input terminals 11 and 12 into a three-phase AC current Iac on output terminals 15, 16, 17, and 19. Terminals 15, 16, and 17 represent the terminals of the different phases and terminal 19 represents the optional neutral terminal.

Figure 2:
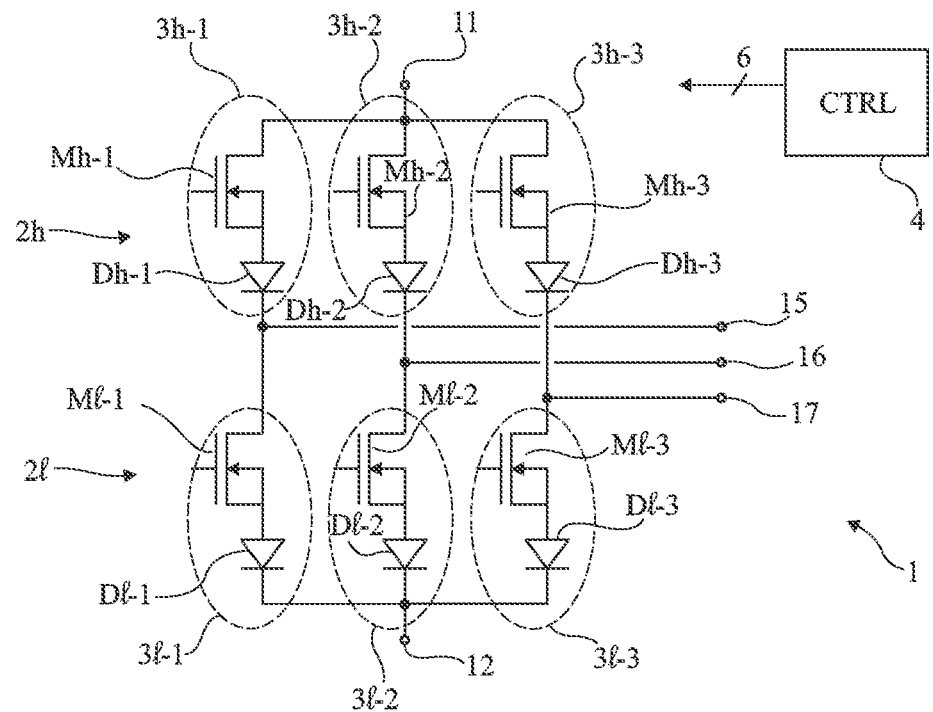
FIG. 2 shows an electrical scheme of a three-phase current inverter.

FIG. 2 shows an electrical scheme of a three-phase current inverter.

Inverter 1 comprises two switching units 2h and 2l having similar inner structures. Each unit 2h, 2l comprises three switching cells, cyclically implying two of the three identical switches, respectively 3h-1, 3h-2, 3h-3 and 3l-1, 3l-2, 3l-3, each formed of a MOS transistor (with an N channel) respectively Mh-1, Mh-2, Mh-3, Ml-1, Ml-2, Ml-3, in series with a diode, respectively Dh-1, Dh-2, Dh-3, Dl-1, Dl-2, Dl-3. The drains of transistors Mh-1, Mh-2, and Mh-3 are interconnected to terminal 11 of application of a first potential of current source Idc. The sources of transistors Mh-1, Mh-2, and Mh-3 are respectively connected to the anodes of diodes Dh-1, Dh-2, and Dh-3, having their cathodes respectively connected to terminals 15, 16, and 17 of the three AC voltage phases. The drains of transistors Ml-1, Ml-2, Ml-3 are respectively connected to terminals 15, 16, and 17. The sources of transistors Ml-1, Ml-2, and Ml-3 are respectively connected to the anodes of diodes Dl-1, Dl-2, and Dl-3, which have their cathodes interconnected to terminal 12 of application of a second potential of current source Idc.

The gates of transistors Mh-1, Mh-2, Mh-3, Ml-1, Ml-2, Ml-3 are individually connected to a control circuit 4 (CTRL) in charge of organizing the switching of the different cells to generate a three-phase AC current Iac. In a current inverter, the current flow successively takes place in each of the switching cells (for example, 3h-1/3h-2, 3h-1/3h-3, 3h-2/3h-3) of a first unit jointly with each of the switching cells (for example, 3l-1/3l-2, 3l-1/3l-3, 3l-2/3l-3) of the other unit. The 9 combinations enabling to generate the three-phase AC current with the appropriate phase shifts are thus obtained. The control of such a current inverter is usual.

In the present description, the high or low unit of the three-phase current inverter to which the element identified by the reference number belongs is identified by letter "h" or "l". Further, the references are completed with "–", "–2", or "–3" to identify the switching branch (representing the phase of the AC voltage) containing the element identified by the reference number. Such reference complements may be omitted when no distinction needs to be made for the needs of the disclosure.

Figure 3:
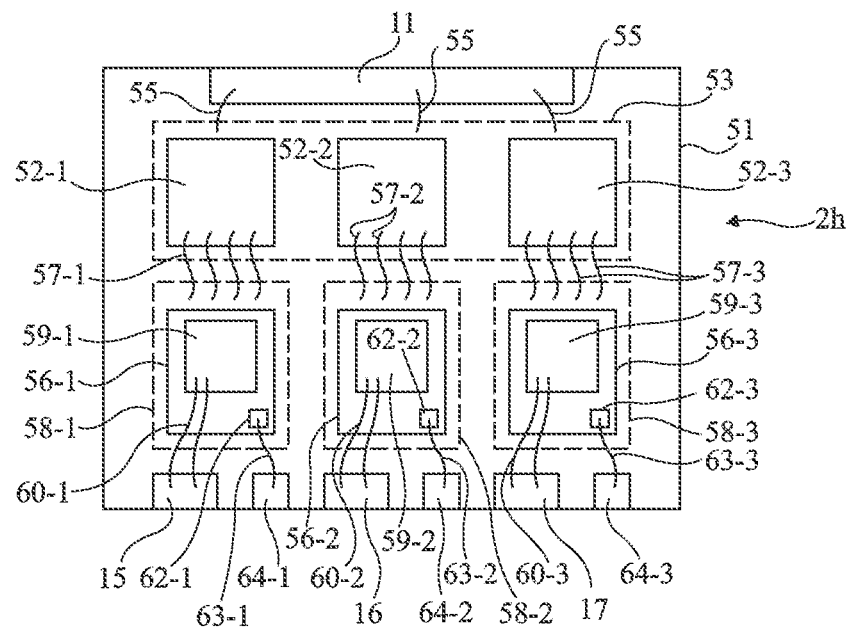
FIG. 3 is a simplified representation of a usual architecture of a switching unit of a three-phase current inverter.

FIG. 3 is a simplified representation of a usual architecture of a switching unit of a three-phase current inverter.

In power applications targeted by the present description, the transistors and diodes are manufactured in the form of vertical components made of semiconductor materials assembled at the surface of an insulated metal substrate 51.

In the example of FIG. 3, a high unit 2h, having its diodes and transistors inverted with respect to FIG. 2, is considered. The anodes of diodes Dh-1, Dh-2, Dh-3 are thus interconnected to terminal 11. The three diodes Dh-1, Dh-2 and Dh-3 are individually formed on P-type substrates and the cathodes are formed by N-type regions in the substrates. The anode electrodes are generally made in the form of a back-side metallization of the chips forming diodes Dh-1, Dh-2, Dh-3 and are placed on a conductive area 53 (typically, a metal conductive plane) of insulated metal substrate 51. An electrically-conductive area of the insulated metal substrate defining terminal 11 is connected to plane 53 by one or a plurality of wires 55. Transistors Mh-1, Mh-2, and Mh-3 are also individually manufactured in the form of chips 56-1, 56-2, and 56-3. The drain electrode of each transistor, generally made in the form of a back-side metallization of the chip, is placed on a conductive area 58-1, 58-2, and 58-3, respectively, of insulated metal substrate 51. The cathode electrodes corresponding to front-side metallizations 52-1, 52-2, and 52-3 of the chips forming diodes Dh-1, Dh-2, and Dh-3 are respectively electrically connected to areas 58-1, 58-2, and 58-3 by one or a plurality of wires 57-1, 57-2, 57-3. The source electrode of each transistor Mh-1, Mh-2, Mh-3 corresponds to a front-side metal contact, respectively 59-1, 59-2, 59-3, connected by one or a plurality of wires 60-1, 60-2, 60-3 to a contact of the insulated metal substrate, defining a terminal, respectively 15, 16, 17. The gates of transistors Mh-1, Mh-2, and Mh-3 are continued on the front side of the chips by contacts 62-1, 62-2 and 62-3, individually connected by one or a plurality of wires 63-1, 63-2, 63-3, to respective contacts of insulated metal substrate 51, defining terminals 64-1, 64-2, 64-3 intended to be connected to control circuit 4 (FIG. 2).

An architecture such as illustrated in FIG. 3 where the chips are placed next to one another generates functional thermal and electrical stress, different according to the operating phases, which adversely affects its reliability.

Further, there is an imbalance between the different conductive meshes, which also adversely affects the operation.

The embodiments which will be described result from a new analysis based on the architecture or the layout of the different switching cells on an insulated metal substrate. This analysis takes into account the specificity of a current inverter, which is that two of the three switches are cyclically implied during switching operations.

It is in particular provided to make the electrical and thermal stress undergone by the different chips of the switch identical whatever the phase. Thus, the aging is homogenized, which increases the reliability of the switches.

More particularly, it is provided to arrange at least the switches of the switching cells around (at the periphery of) a central area with, in the plane, a symmetry of revolution of order 3 with respect to the center of the structure. In other words, the structure substantially has a symmetry of revolution of 120°.

Figure 4:
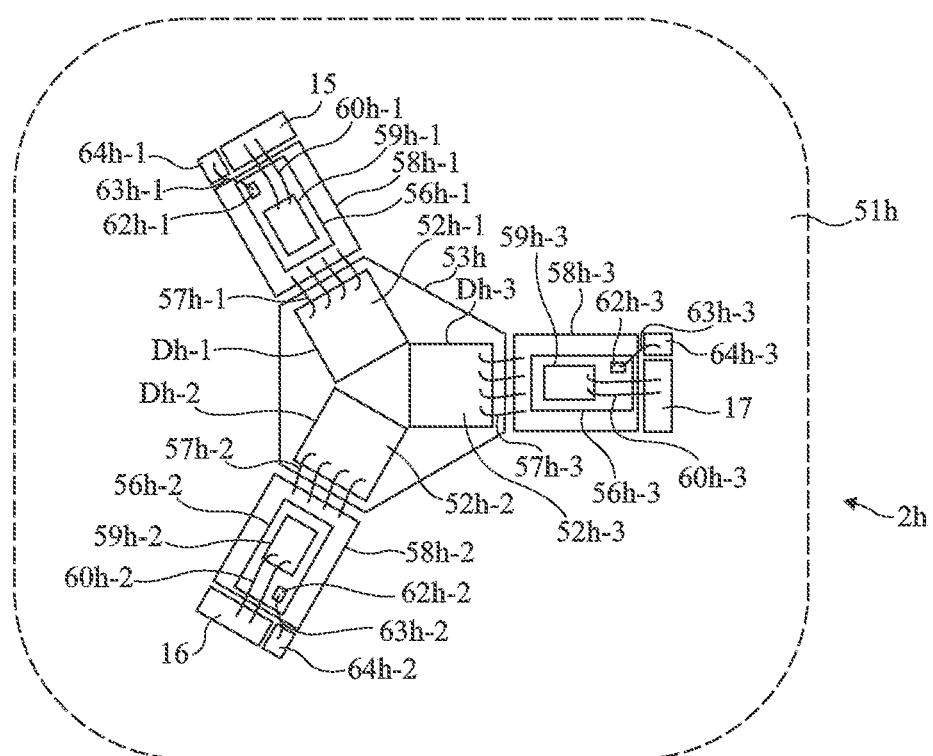
FIG. 4 very schematically shows an embodiment of an architecture of a first unit of a three-phase current inverter.

FIG. 4 very schematically shows an embodiment of an architecture of a first unit $2h$ of a three-phase current inverter.

Figure 5:
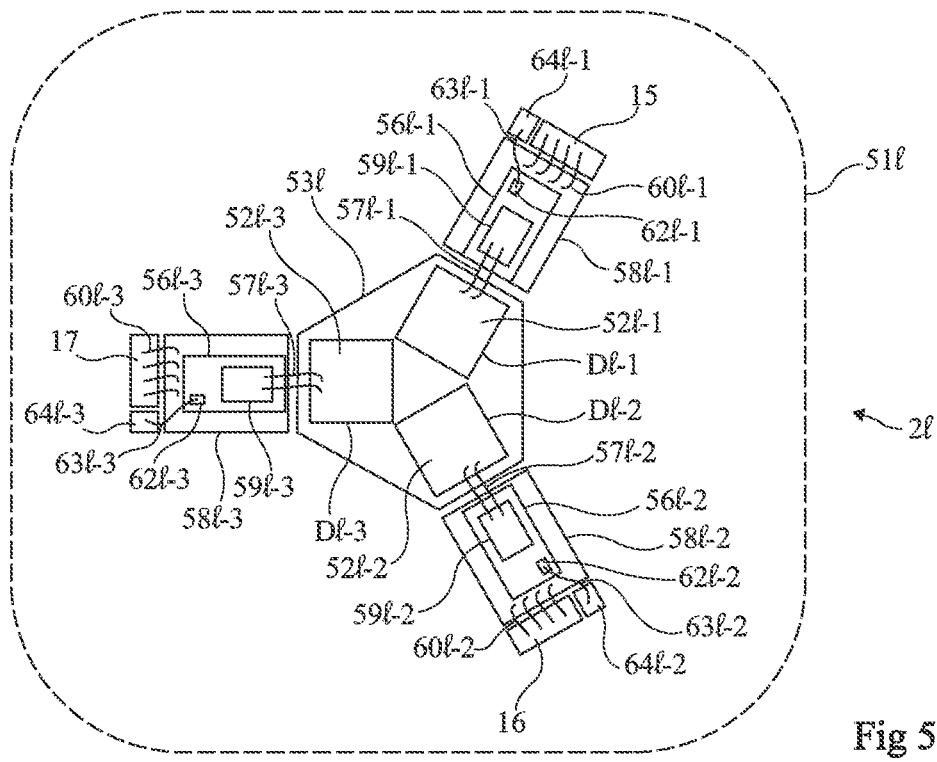
FIG. 5 very schematically shows an embodiment of an architecture of a second three-phase current inverter unit.

FIG. 5 very schematically shows an embodiment of an architecture of a second unit $2l$ of a three-phase current inverter.

In the example of FIGS. 4 and 5, a star- or Y-shaped structure where, for each unit $2h$, $2l$, the three diodes of the cells are arranged at the center of the structure and the transistors are arranged in the branches of the Y, is considered.

As previously, the diodes and transistors are manufactured individually in the form of discrete chips of vertical components made of semiconductor materials, and are assembled on an insulated metal substrate 51, called $51h$ in FIG. 4 for first unit $2h$ and $51l$ in FIG. 5 for second unit $2l$. A metallized central area $53h$ (FIG. 4), $53l$ (FIG. 5), has a shape with a symmetry of revolution of order 3 in the plane with respect to its center, for example, a hexagonal shape. Three peripheral metallized areas $58h$-1, $58h$-2, $58h$-3 (FIG. 4), respectively $58l$-1, $58l$-2, $58l$-3 (FIG. 5) are formed in each portion $51h$, $51l$ of the insulated metal substrate. For example, each area 58 is rectangular and has an edge parallel to a side of the hexagon 53 around which it is provided, a free end of hexagonal area 53 separating two sides each having an area 58 opposite thereto.

Figure 6:
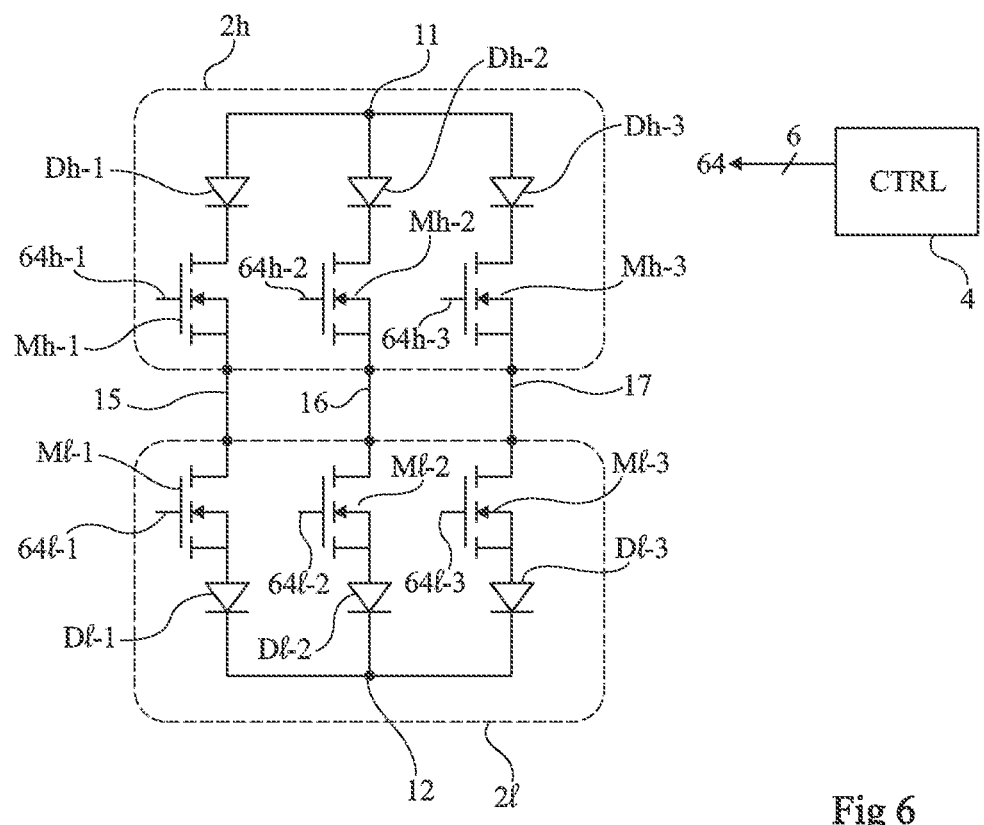
FIG. 6 shows the electrical scheme of a three-phase current inverter formed with the units of FIGS. 4 and 5.

In the embodiment of FIGS. 4 and 5, it is provided to place the diodes at the centers of the structures. Accordingly, for unit $2h$ (FIG. 4), the anode electrodes of diodes Dh-1, Dh-2, Dh-3 are assembled (welded) on area $53h$, while for unit $2l$, the cathode electrodes of diodes Dl-1, Dl-2, Dl-3 (FIG. 5) are assembled (welded) to area $53l$. The electrical scheme which will be discussed hereafter in relation with FIG. 6 is thus different from that of FIG. 2.

The back-side drain contact of each chip $56h$-1, $56h$-2, $56h$-3 (FIG. 4), $56l$-1, $56l$-2, and $56l$-3 (FIG. 5), forming a transistor Ml-1, Ml-2, Ml-3 (FIG. 4), Mh-1, Mh-2, Mh-3 (FIG. 5), is assembled (welded) on an area 58, respectively $58h$-1, $58h$-2, $58h$-3 (FIG. 4) or $58l$-1, $58l$-2, $58l$-3 (FIG. 5) of the concerned unit.

For unit $2h$ (FIG. 4), the cathode electrodes corresponding to front-side metallizations $52h$-1, $52h$-2, and $52h$-3 of the chips forming diodes Dh-1, Dh-2, and Dh-3 are respectively electrically connected to areas $58h$-1, $58h$-2, and $58h$-3 by one or a plurality of wires $57h$-1, $57h$-2, $57h$-3. The source electrode of each transistor Mh-1, Mh-2, Mh-3 corresponds to a front-side metal contact, respectively $59h$-1, $59h$-2, $59h$-3 connected by one or a plurality of wires $60h$-1, $60h$-2, $60h$-3 to a contact of the printed circuit, defining a terminal, respectively 15, 16, 17. The gates of transistors Mh-1, Mh-2, and Mh-3, are continued on the front side of chips 56 by contacts $62h$-1, $62h$-2, $62h$-3. These contacts are individually connected by one or a plurality of wires $63h$-1, $63h$-2, $63h$-3 to respective contacts of the printed circuit, defining terminals $64h$-1, $64h$-2, $64h$-3, intended to be connected to control circuit 4 (FIG. 2).

For unit $2l$ (FIG. 5), the anode electrodes corresponding to front-side metallizations $54l$-1, $54l$-2, and $54l$-3 of the chips forming diodes Dl-1, Dl-2, and Dl-3 are respectively electrically connected, by one or a plurality of wires $57l$-1, $57l$-2, $57l$-3, to the respective source electrodes of transistors Ml-1, Ml-2, and Ml-3 corresponding to a front-side metal contact, respectively $59l$-1, $59l$-2, $59l$-3, of the chips forming the transistors. Areas $58l$-1, $58l$-2, and $58l$-3 are respectively connected, by one or a plurality of wires $60l$-1, $60l$-2, $60l$-3, to a contact of the insulated metal substrate, defining a terminal, respectively 15, 16, 17. The gates of transistors Ml-1, Ml-2, and Ml-3, are continued at the front side of chips 56 by contacts $62l$-1, $62l$-2, $62l$-3. These contacts are individually connected by one or a plurality of wires $63l$-1, $63l$-2, $63l$-3 to respective contacts of the insulated metal substrate, defining terminals $64l$-1, $64l$-2, $64l$-3, intended to be connected to control circuit 4 (FIG. 2).

FIG. 6 shows the electrical scheme of a current inverter formed with the units of FIGS. 4 and 5.

As compared with the scheme of FIG. 2, the respective positions of the diodes and transistors of high unit $2h$ are inverted, that is, diodes Dh have their anodes interconnected to terminal 11 while transistors Mh-1, Mh-2, and Mh-3 have their respective sources connected to terminals 15, 16, and 17. Low unit $2l$ is, in terms of electric connection, similar to that of FIG. 2.

Figure 7:
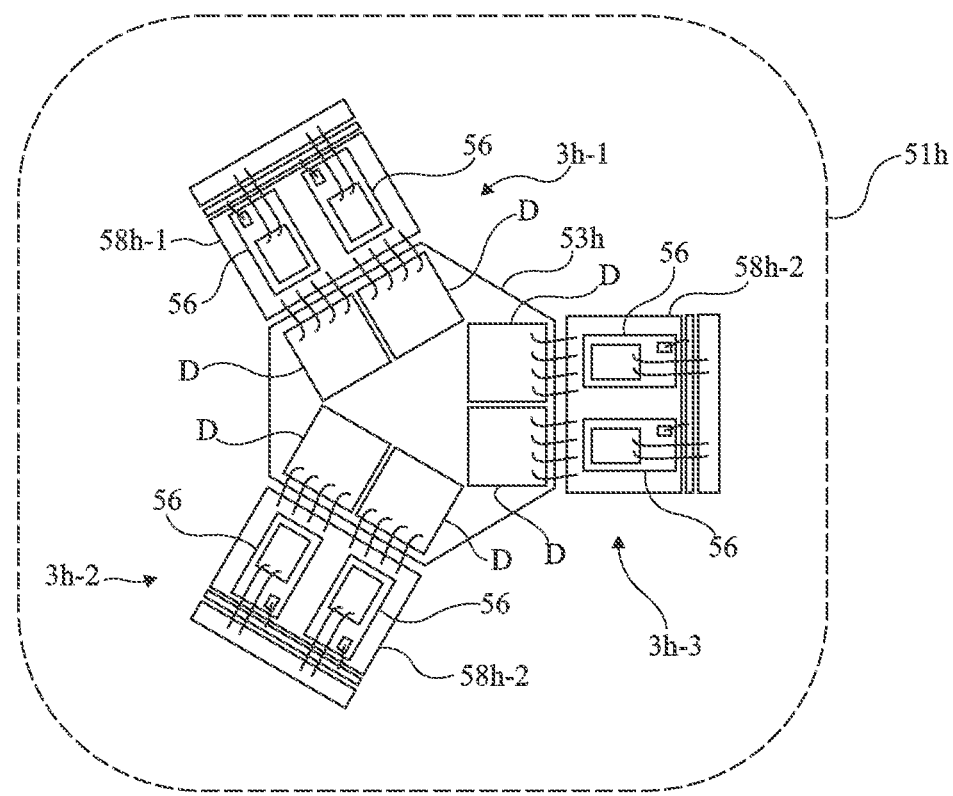
FIG. 7 shows a variation of the embodiment of FIG. 4.
Figure 8:
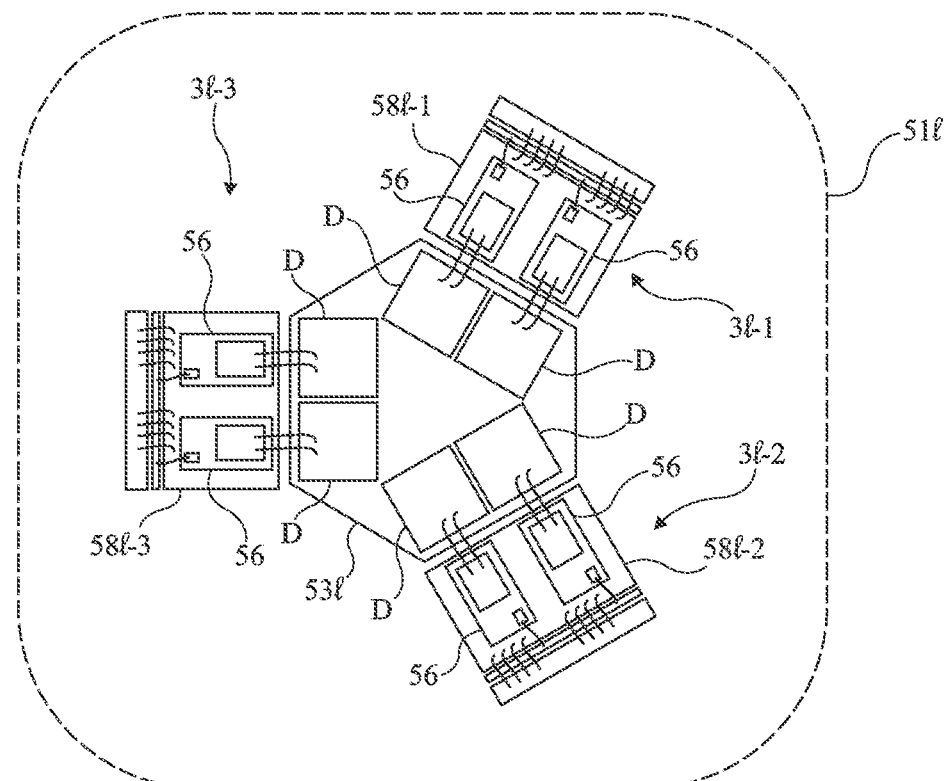
FIG. 8 shows a variation of the embodiment of FIG. 5.

FIG. 7 shows a variation of the embodiment of FIG. 4.
FIG. 8 shows a variation of the embodiment of FIG. 5.
FIGS. 7 and 8 illustrate the possibility of providing, at the level of each switching cell 3, a plurality of diodes and transistors in parallel. Thus, in FIGS. 7 and 8, metal areas $58h$-1, $58h$-2, $58h$-3, $58l$-1, $58l$-2, $58l$-3 of insulated metal substrates $51h$ and $51l$ each for example receive two transistor chips 56, and central areas $53h$ and $53l$ each receive three pairs of diodes D. The connections are similar to those discussed in relation with FIGS. 4 and 5.

A layout of the chips such as illustrated in FIGS. 4 and 5, or 7 and 8, has the advantage of homogenizing the electrical and thermal behavior of the different current flow meshes. Indeed, the geometrical symmetry between the different switching cells results in that the three possible switching meshes $3h$-1/$3h$-2, $3h$-2/$3h$-3, and $3h$-1/$3h$-3 for high unit $2h$ and the three possible switching meshes $3l$-1/$3l$-2, $3l$-2/$3l$-3, and $3l$-1/$3l$-3 for low unit $2l$ have a same electrical behavior. In particular, the impedances of the different switching meshes used are identical and the overvoltage levels seen by the different switches are identical. Further, their thermal behavior is also homogenized due to this geometrical symmetry.

Figure 9:
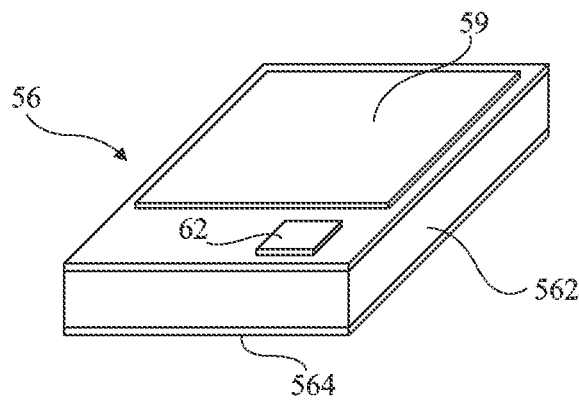
FIG. 9 is a very simplified representation of a semiconductor circuit chip forming a vertical power transistor.

FIG. 9 is a very simplified representation of a semiconductor circuit chip 56 forming a vertical power transistor M.

According to this example, transistor M is formed in a substrate 562 having the source and drain regions formed therein. A back-side metallization 564 (generally full plate) defines drain contact D. On the front side, metallization areas 59 and 62 define source and gate contacts S and G. A plurality of parallel areas 59 may be present. Chip 56 is preferably intended to be assembled by its back side on an insulated metal substrate.

Figure 10:
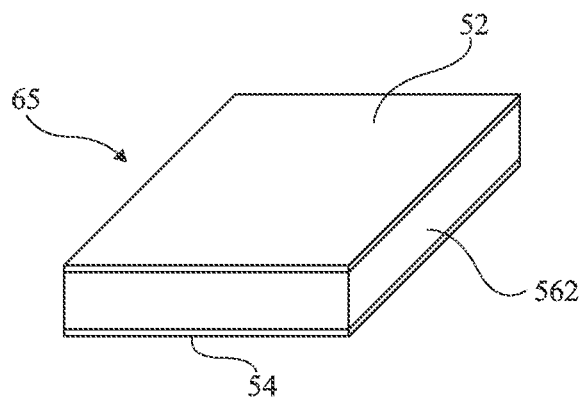
FIG. 10 is a very simplified representation of a semiconductor circuit chip forming a vertical diode.

FIG. 10 is a very simplified representation of a semiconductor circuit chip 65 forming a vertical diode D.

According to this example, diode D is formed in a substrate 652 having a P-type doped front side. A back-side metallization 54 (for example, full plate) defines the cathode electrode while a front-side metallization 52 (for example, full plate) defines the anode electrode.

In the embodiments of FIGS. 4, 5, 7, and 8, diodes Dh-1, Dh-2, and Dh-3 are assembled on the insulated metal substrate by their anode metallization, that is, by the P-type electrode. It may be desirable to be able to assemble all the diodes of the current inverter by placing their cathode electrodes on the insulated metal substrate.

Figure 11:
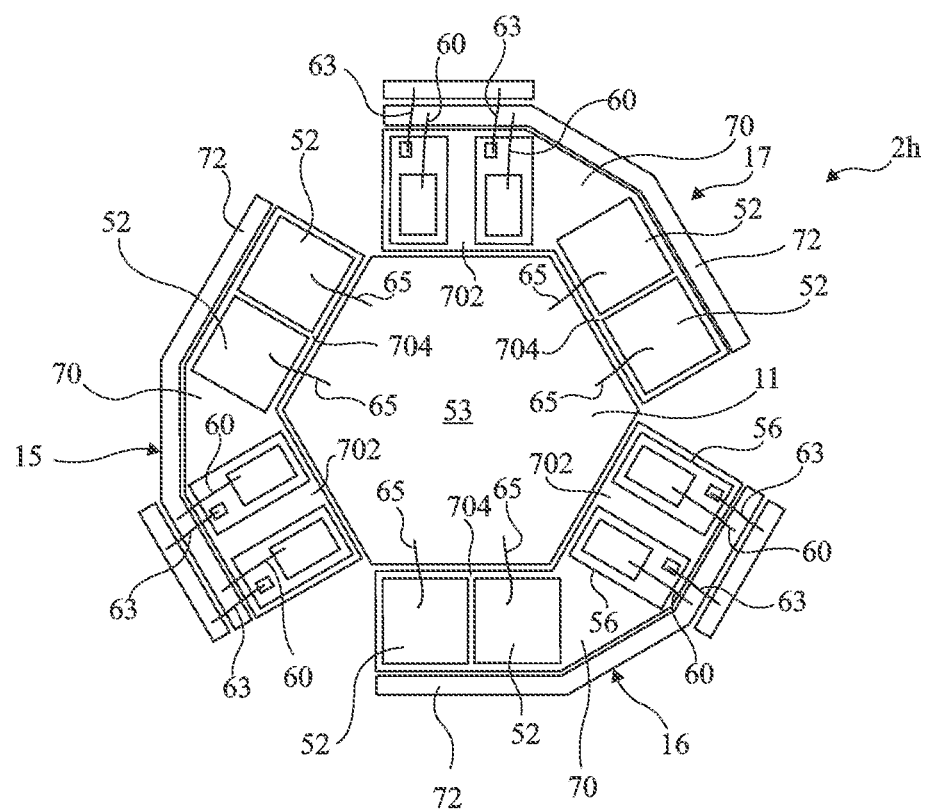
FIG. 11 very schematically shows another embodiment of an architecture of a first unit of a three-phase current inverter.

FIG. 11 very schematically shows another embodiment of an architecture of a first unit 2h of a three-phase current inverter.

Figure 12:
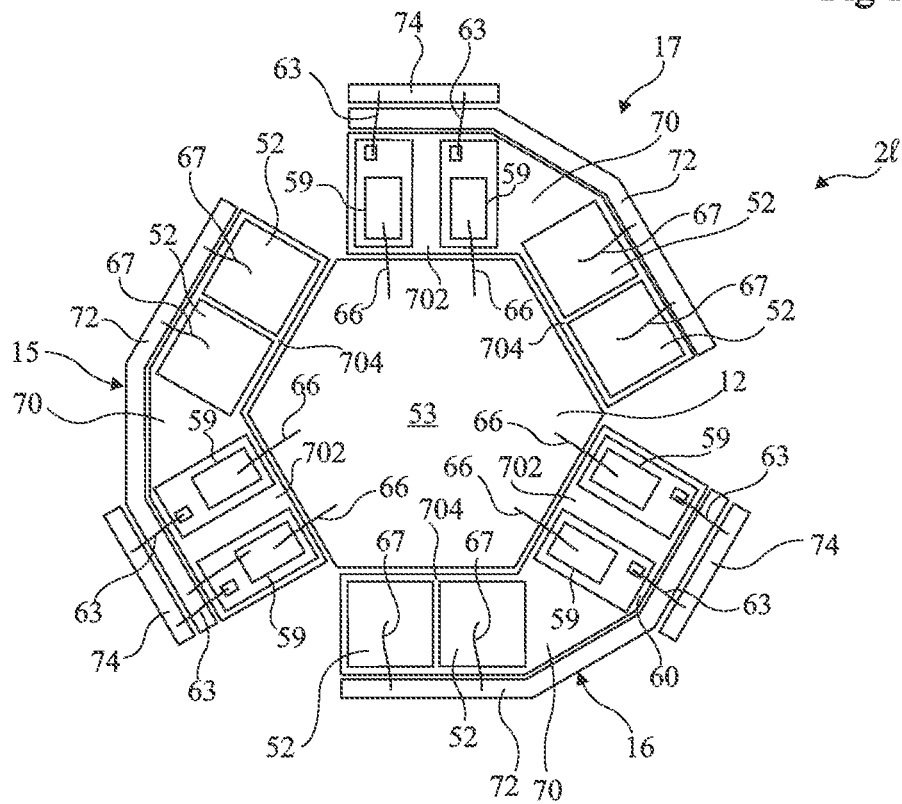
FIG. 12 very schematically shows another embodiment of an architecture of a second unit of a three-phase current inverter.

FIG. 12 very schematically shows another embodiment of an architecture of a second unit 2l of a three-phase current inverter.

The embodiments of FIGS. 11 and 12 fulfill the aim of assembling all the diodes by placing their cathode electrodes on the insulated metal substrate.

To achieve this, it is provided to modify the electrical assembly, that is, the electrical scheme of the three-phase current inverter.

Figure 13:
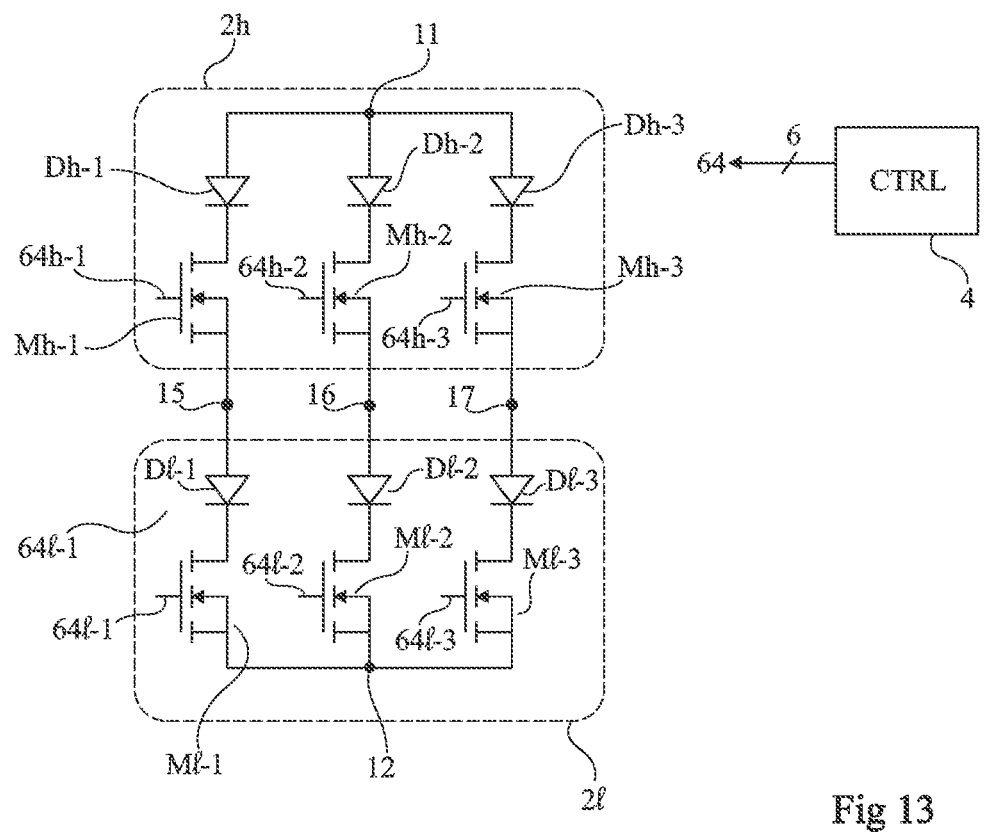
FIG. 13 shows the electrical scheme of a three-phase current inverter formed with the units of FIGS. 11 and 12.

FIG. 13 very schematically shows the electrical scheme of a three-phase current inverter according to the embodiment of FIGS. 11 and 12.

From an electrical scheme viewpoint, high unit 2h is identical to that of the embodiment of FIG. 6, that is, diodes Dh all have their anodes connected to terminal 11 and the sources of transistors Mh-1, Mh-2, and Mh-3 are respectively connected to terminals 15, 16, and 17. The cells of low unit 2l however have the positions of the diodes and transistors inverted with respect to the embodiment of FIG. 6. In other words, the respective anodes of diodes Dl-1, Dl-2 and Dl-3 are respectively connected to terminals 15, 16, and 17, and the sources of transistors Ml-1, Ml-2, and Ml-3 are all connected to terminal 12. As in the previous embodiments, gates 64 of the transistors are connected to a control circuit 4.

The architecture described in relation with FIGS. 11 and 12 is based on metallized central areas 53 having a hexagonal shape, no component being placed thereon. These areas respectively define terminals 11 and 12 of the three-phase current inverter. Further, all the switching cells are structurally identical and only differ by the wire connections achieved once the components have been assembled on the insulated metal substrate. Thus, for all the switching cells, first identical metallization portions 70, each having the shape of a portion of a hexagonal ring-shaped strip forming two side of the hexagon, are provided. Each end of a portion 70 is for example orthogonal to the hexagon section that it ends. Further, each portion 70 receives identical diodes and transistors assembled in the same way, that is, by their respective back sides.

Although, in the example of FIGS. 11 and 12, two transistors M and two diodes D per switching cell are provided, it is possible to only provide one transistor and one diode, or more than two of each. Further, to respect the symmetry, transistors M are all assembled on first sections 702 of respective portions 70 and the diodes are all assembled on second sections 704 of portions 70.

Each portion 70 is associated with another conductive portion 72 of a ring-shaped hexagon surrounding the first one (that having portions 70 formed therein). Of course, in the same way as between area 53 and portions 70, portions 70 and portions 72 are spaced apart from one another to be electrically insulated. Finally, vertically in line with sections 702 supporting transistors M, a conductive strip 74 defining the gate terminal of the transistor(s) of each cell is provided outside of the corresponding portion 72.

All the diodes and all transistors M are assembled on conductive portions 70 by their respective back sides. Accordingly, for the transistors, the apparent (upper) contacts are source contacts 59 and gate contacts 62. For diodes D, apparent metallization 52 corresponds to the anode electrode.

Whatever the unit, gate contacts 62 are connected by wires 63 to the respective conductive strips of the cells.

For high unit 2h (FIG. 11), the anode contacts 52 of all diodes D are connected by wires 65 to central portion 53, while the source contacts 59 of the different transistors M are connected to portion 72 of the corresponding cell by wires 60.

For low unit 2l (FIG. 12), all the source contacts 59 of transistors M are connected to central portion 53 (terminal 12) by wires 66, while the anode contacts 52 of the different diodes D are connected to portion 72 of the corresponding cell by wires 67.

It can thus be seen that the only two differences between high units and low units are the connections by wires 60 or 66 of the transistor sources and by wires 65 or 67 of the diode anodes.

Such an embodiment eases the manufacturing by allowing common structures for the high and low units as long as possible in the industrial process.

As a variation, the connection wires provided in FIGS. 11 and 12 are replaced with rigid planar connection elements.

Figure 14:
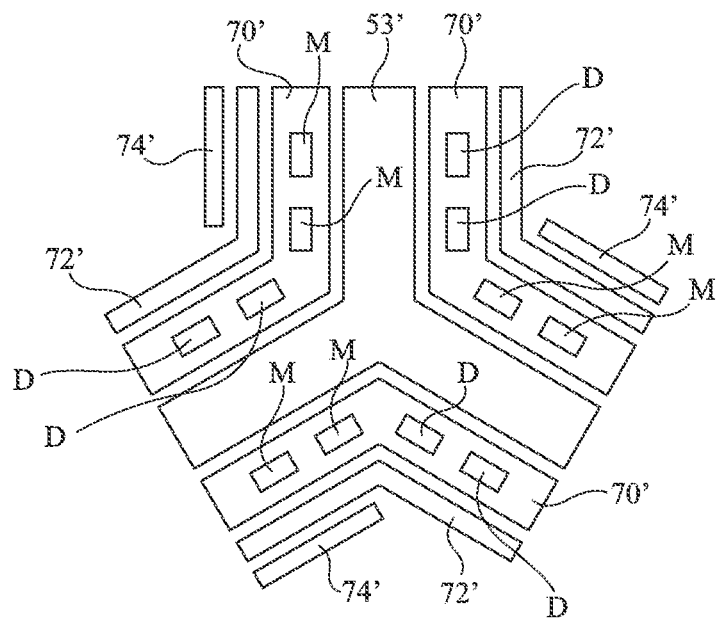
FIG. 14 is a simplified representation of a variation of the embodiments of FIGS. 11 and 12.

FIG. 14 is a simplified representation of an alternative embodiment of a unit of FIGS. 11 and 12 where central area 53' is Y-shaped.

Portions 70', similar to portions 70 described in relation with FIGS. 11 and 12, support diodes D and transistors M, but their layout is inverted to follow, with a complementary shape, the Y shape of central area 53'. Similarly, portions 72' and 74', similar to portions 72 and 74 of FIGS. 11 and 12, are provided to define terminals 15, 16, and 17 as well as the transistor control terminals. To simplify the representation of FIG. 14, the wire connections have not been shown.

Figure 15:
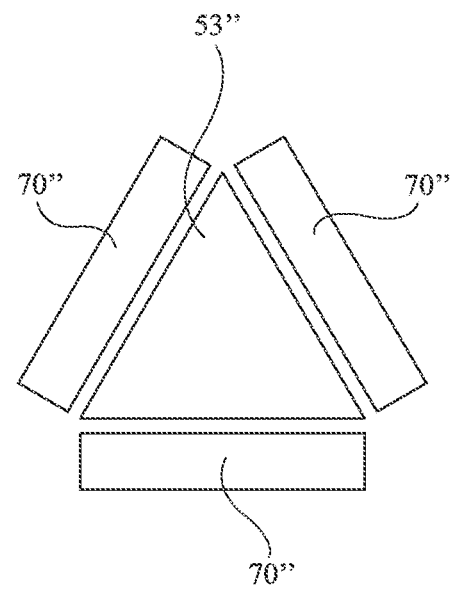
FIG. 15 is a very simplified partial representation of another alternative embodiment.

FIG. 15 is a simplified representation of another alternative embodiment of a unit where central area 53" is triangular and areas 72" are rectilinear and parallel to the sides of the triangle of area 53". For simplification, the rest of the unit has not been shown in FIG. 15.

Other shapes may be provided for the metal areas of the printed circuit receiving the switching cells, provided to respect a central area and peripheral areas having a symmetry of revolution of order 3, that is, a shift by approximately 120 degrees, preferably exactly 120 degrees, from one cell to the other around the center of the plane containing the unit.

An advantage of the embodiments which have been described is that it is now possible to form a three-phase current inverter where the electrical and thermal behaviors of the different switching meshes are identical.

The described embodiments particularly apply to applications of conversion of the power supplied by photovoltaic panels.

Various embodiments and variations have been described. Certain embodiments and variations may be combined and other variations and modifications which will occur to those skilled in the art. In particular, the electrically-conductive areas of the substrate are of course separated from one another to be electrically insulated. Further, these areas may be connected by conductive tracks or wires to other metal regions of the substrate, particularly to connect the inverter to upstream and downstream circuits. Further, although reference has been more specifically made to the use of an insulated metal substrate, preferably a metal substrate on ceramic, the substrate having the components assembled thereon may be any other adapted substrate, for example, a printed circuit, a direct bond copper substrate, etc. Further, each switch may be in fact formed of a plurality of switches in parallel. The selection of the dimensions and of the number of chips to be assembled in parallel to form each switch of an inverter depends on the application and, among others, on the desired operation power.

Further, although the embodiments have been described in relation with an example applied to switching cells formed of a MOS transistor series-connected with a diode, they may be transposed to other three-phase switching structures, forming or not a switch which is bidirectional in terms of voltage and unidirectional in terms of current, where similar problems are posed. For example, the diode function may be carried out by a MOS transistor. In this case, all cells are identical and the high and low units may also have an identical structure and comprise identical wire connections.

It should be noted that the two units of a same three-phase current inverter are not necessarily paired on a same integrated circuit (in a same plane) but may be stacked with an interposed insulator (for example, back side against back side of the printed circuits supporting the units), by connecting terminals 15, 16, and 17 by means of vias.

Finally, the practical implementation of the embodiments and variations which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A three-phase current inverter, comprising:
    a first three phase switching unit and a second three-phase switching unit, each of the first and second three-phase switching units comprising:
        a conductive central area of a substrate; and
        three identical switching cells arranged around and radially spaced from the conductive central area with a symmetry of revolution of order 3, each of the three identical switching cells comprising at least one first electrically-controlled switch in series with at least one second spontaneous conduction switch,
        wherein the conductive central area defines an input terminal of the three-phase current inverter to which the three identical switching cells are electrically interconnected; and
        wherein the three identical switching cells of the first three-phase switching unit and the three identical switching cells of the second three-phase switching unit are electrically connected two by two, interconnection nodes connecting the first and second three-phase switching units defining three phase terminals.

2. The three-phase current inverter of claim 1, wherein the at least one second spontaneous conduction switch of each of the three identical switching cells is assembled in the conductive central area of the substrate with a second symmetry of revolution of order 3.

3. The three-phase current inverter of claim 1, wherein the conductive central area of the substrate supports no component.

4. The three-phase current inverter of claim 1, wherein the conductive central area of the substrate has a third symmetry of revolution of order 3.

5. The three-phase current inverter of claim 1, wherein the at least one first electrically-controlled switch and the at least one second spontaneous conduction switch of the three identical switching cells are arranged on conductive peripheral areas of the substrate having a fourth symmetry of revolution of order 3.

6. The three-phase current inverter of claim 5, wherein the conductive central area and the peripheral areas of the substrate approximately form a Y shape.

7. The three-phase current inverter of claim 1, wherein the conductive central area of the substrate has a substantially hexagonal shape.

8. The three-phase current inverter of claim 1, wherein said at least one first electrically-controlled switch comprises a plurality of transistors.

9. The three-phase current inverter of claim 1, wherein said at least one second spontaneous conduction switch comprises a diode, or a MOS transistor.

10. The three-phase current inverter of claim 1, wherein each of the at least one first electrically-controlled switch is welded to a conductive area by a back-side metallization of a chip made of semiconductor materials, defining an electrode of the at least one first electrically-controlled switch.

11. The three-phase current inverter of claim 1, wherein the substrate is an insulated metal substrate.

12. A system comprising:
    an assembly of photovoltaic panels; and
    the three-phase current inverter of claim 11.

13. The three-phase current inverter of claim 1, wherein each of the first and second three-phase switching units comprises three phase terminal electrodes.

14. A multi-phase current inverter, comprising:
    two switching units, each coupling a respective one of two direct current (DC) ports to a plurality of alternating current (AC) terminals;
    first and second pluralities of switching cells respectively forming the two switching units, each of the first and second pluralities of switching cells comprising an electrically-controlled switch coupled in series with a spontaneous conduction switch,
    wherein each of the first and second pluralities of switching cells is configured for unidirectional conduction of current;
    wherein the first plurality of switching cells are identical and are arranged around and radially spaced from a first conductive central area of at least one substrate with a symmetry of revolution of order 3; and
    wherein the second plurality of switching cells are identical and are arranged around and radially spaced from a second conductive central area of the at least one substrate with a symmetry of revolution of order 3.

15. The multi-phase current inverter of claim 14, wherein the spontaneous conduction switch of each of the first plurality of switching cells is assembled in the first conductive central area of the at least one substrate.

16. The multi-phase current inverter of claim 14, wherein the first conductive central area of the at least one substrate does not support the spontaneous conduction switches of the first plurality of switching cells.

17. The multi-phase current inverter of claim 14, wherein the electrically-controlled switch of each of the first and second pluralities of switching cells comprises a transistor, and the spontaneous conduction switch of each of the first and second pluralities of switching cells comprises a diode or a MOS transistor.

18. The multi-phase current inverter of claim 14, wherein the multi-phase current inverter is a three-phase inverter, and the first plurality of switching cells and the second plurality of switching cells each include three switching cells.

19. The multi-phase current inverter of claim 14, wherein each of the two switching units comprises a plurality of phase terminal electrodes, each of the plurality of AC terminals comprising one of the plurality of phase terminal electrodes of each of the two switching units.

* * * * *